United States Patent
Chaudhuri et al.

(10) Patent No.: US 10,042,966 B2
(45) Date of Patent: Aug. 7, 2018

(54) COMPUTING RESOURCE ALLOCATION BASED ON FLOW GRAPH TRANSLATION

(71) Applicant: Wave Semiconductor, Inc., Campbell, CA (US)

(72) Inventors: Samit Chaudhuri, Cupertino, CA (US); Henrik Esbensen, Vista, CA (US); Kenneth Shiring, San Jose, CA (US); Peter Ramyalal Suaris, Woodland Hills, CA (US)

(73) Assignee: Wave Computing, Inc., Campbell, CA (US)

( * ) Notice: Subject to any disclaimer, the term of this patent is extended or adjusted under 35 U.S.C. 154(b) by 110 days.

(21) Appl. No.: 14/928,314

(22) Filed: Oct. 30, 2015

(65) Prior Publication Data
US 2016/0125118 A1 May 5, 2016

Related U.S. Application Data (60) Provisional application No. 62/073,436, filed on Oct. 31, 2014.

(51) Int. Cl.
*G06F 17/50* (2006.01)

(52) U.S. Cl.
CPC ................. *G06F 17/5054* (2013.01)

(58) Field of Classification Search
CPC ............ G06F 17/5045; G06F 17/5072; G06F 2217/68; G06F 8/40; G06F 11/3404; G06F 9/5077; G06F 15/7867; G06F 17/5009; G06F 17/5022; G06F 2209/5012; G06F 9/3891; G06F 9/4881; G06F 9/505; G06F 9/5061
See application file for complete search history.

(56) References Cited

U.S. PATENT DOCUMENTS

| | | | |
|---|---|---|---|
| 6,553,395 B2 | 4/2003 | Marshall et al. | |
| 6,907,592 B1 | 6/2005 | Dante | |
| (Continued) | | | |

OTHER PUBLICATIONS

Cathev, C. L., Jason D. Bakos, and Duncan Buell. "A reconfigurable distributed computing fabric exploiting multilevel parallelism." Field-Programmable Custom Computing Machines, 2006. FCCM'06. 14th Annual IEEE Symposium on. IEEE, 2006.

*Primary Examiner* — Nghia Doan
(74) *Attorney, Agent, or Firm* — Adams Intellex, PLC (57) ABSTRACT

Systems and methods are disclosed for computing resource allocation based on flow graph translation. First, a high-level description of logic circuitry is obtained and translated to generate a flow graph representing sequential operations. Using the flow graph, similar processing elements in an array are interchangeably allocated to perform computational, communication, and storage tasks as needed. The sequential operations are executed using the array of interchangeable processing elements. Data is provided from the storage elements through the communication elements to the computational elements. Computational results are stored in the storage elements. Outputs from some of the computational elements provide inputs to other computational elements. Execution of the instructions can be controlled with time stepping. The processors are reallocated as needed, based on changes to the flow graph.

26 Claims, 9 Drawing Sheets

(56) References Cited

U.S. PATENT DOCUMENTS

| | | |
|---|---|---|
| 7,679,399 B2 | 3/2010 | Madurawe |
| 7,759,969 B2 | 7/2010 | Madurawe |
| 2005/0188364 A1* | 8/2005 | Cockx ................ G06F 8/456 717/159 |
| 2007/0198971 A1* | 8/2007 | Dasu .................. G06F 8/433 717/140 |
| 2009/0243650 A1 | 10/2009 | Madurawe |
| 2010/0017761 A1* | 1/2010 | Higuchi ............ G06F 17/5054 716/103 |
| 2010/0017774 A1* | 1/2010 | Bachina ............ G06F 17/5054 716/128 |
| 2013/0135008 A1 | 5/2013 | Zhang et al. |
| 2013/0290919 A1* | 10/2013 | Narayanaswamy ................ G06F 17/5009 716/106 |
| 2014/0359563 A1* | 12/2014 | Xie .................... G06F 8/34 717/106 |

* cited by examiner

ACC0 = IN_A;
ACC1 = IN_B;            \\ Load accumulators
ACC2 = IN_C;
ACC3 = IN_D;

N1 = XOR(ACC1, ACC0);   \\ Line 3
N2 = OR(ACC3, ACC2);    \\ Line 4

OUT_E = AND(N1, N2);    \\ Line 5

COMPUTING RESOURCE ALLOCATION BASED ON FLOW GRAPH TRANSLATION

RELATED APPLICATIONS

This application claims the benefit of U.S. provisional patent application "Computing Resource Allocation Based on Flow Graph Translation" Ser. No. 62/073,436, filed Oct. 31, 2014. The foregoing application is hereby incorporated by reference in its entirety.

FIELD OF ART

This application relates generally to resource allocation and more particularly to resource allocation based on flow graph translation.

BACKGROUND

Technological advances in integrated circuit manufacturing processes enable the production of integrated electronic systems comprising tens of millions, hundreds of millions, or even greater numbers of active devices. The active devices contained in an integrated circuit include transistors (bipolar, FET, etc.), diodes, optoelectronic devices, and so on. Increased numbers of insulation and interconnection layers further provide expanded opportunities for complex data paths and more powerful control schemes. As a result, the demand for advanced integrated circuits has driven the development and production of circuits with increased electronic system performance, decreased device size, and greater system feature sets, among many other things. One direct result of technological and systemic improvements is an ever-increasing trend towards design complexity. The design complexity of the electronic systems drives difficult engineering challenges regarding circuit design, system implementation and control, chip fabrication, and the like. This complexity demands increased and meticulous scrutiny of logic circuits, interconnection schemes, systems architectures, and system control. New fabrication technologies, system architectures, and circuit families have been developed which are capable of taking advantage of reduced total device count, smaller device sizes, and simplified wiring/control schemes (e.g. datapaths/control paths). Each circuit family provides its own engineering tradeoffs which include both benefits and costs and requires careful design considerations.

Two broad categories of electronic circuits are used in the construction of integrated circuits. These circuit categories include static circuits and dynamic circuits. Both static and dynamic circuits are used to form the basis of many types of electronic circuits including digital logic, memories, communications circuits, analog circuits, programmable devices, and so on. Static circuits are used primarily in applications where signal integrity and system robustness take priority over other design criteria, such as circuit density and power consumption. In contrast, dynamic circuits are applied where system performance and circuit density are critical. Portable and personal electronic devices such as smartphones, PDAs, tablets, surfaces, and personal computers, among others, require memory and microprocessor circuits with high circuit density, high system performance, extensive feature sets, and low power consumption, to name a few requirements. In order to ensure that the integrated circuits and the systems that contain them will operate properly, testing is performed at many points in the design and fabrication processes. The testing includes circuit modeling and simulation, chip fabrication verification, and so on. The simulation, modeling, and verification are highly computationally intensive because of the extreme complexity and density of the circuits and systems. Efficiency and efficacy are key factors to the success and cost effectiveness of the many manufacturing steps, testing procedures, and processes.

SUMMARY

A method based on flow graph translation is presented for allocating resources of a class of programmable integrated circuits. The integrated circuits are based on an array of circuit elements which can be configured to perform various computational, communicative, and storage operations. The integrated circuit elements simplify the various complexities of configuring traditional programmable integrated circuits, such as FPGAs and multi-core processors, by presenting the programmer with interchangeable, readily reconfigurable elements. The reconfigurable elements are allocated to the various computational, communication, and storage tasks based on a flow graph. The computing resource allocation begins with importing a high-level description for logic circuitry. The high-level description is translated into a flow graph. The flow graph represents the various processing activities described by the high-level description. The flow graph can be a control dataflow graph (CDFG), a hypergraph (HG), and/or another form of flow graph. The translation includes generating sequential operations to carry out the processing activities of the high-level description. The sequential operations are assigned to processing elements which have been allocated to computational, communicative, and storage purposes, based on the flow graph. The sequential operations are executed by the allocated processing elements to which the sequential operations were assigned.

The processing elements are configurable and interchangeable, and can be allocated by purpose, where the purposes include computation, communication, and storage. Based on the structure of the flow graph which is being executed, the sequential code representing multiple nodes of the flow graph can be executed simultaneously. As a result, conflicts can arise when not all of the data required by a given processing element assigned to a computational purpose is ready to execute its assigned sequential instructions. Time slicing can be used to selectively delay operations across one or more rows or columns of the array of processing elements. The delay can be used to ensure the arrival of all required data to computational nodes in order to permit successful execution of the sequential code. When the conflict is resolved, the processing of part or all of the flow graph can proceed. As processing of the flow graph continues, the processing elements are reconfigured as necessary.

Thus, a computer-implemented method for resource allocation is disclosed comprising: importing a high-level description for logic circuitry; translating the high-level description into a flow graph; allocating a first plurality of processing elements within an array, based on the flow graph, for computational purposes; and allocating a second plurality of processing elements, based on the flow graph, for communication purposes including communication between the first plurality of processing elements. The method can include performing execution of the flow graph using the first plurality of processing elements and the second plurality of processing elements. In embodiments, the method includes allocating a third plurality of processing elements within the array for storage purposes and rendering the various processing elements interchangeable.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Many electronic systems are constructed from integrated circuits that are based on logic circuitry. The choice of logic circuitry that is implemented to realize a given electronic system is made using design criteria such as system performance, power requirements, feature sets, and many often-contradictory design requirements. The logic circuitry can be purpose-built using custom integrated circuits and application-specific integrated circuits (ASIC), or the logic circuitry can be based on programmable paradigms. While purpose-built logic typically possesses higher performance and circuit density, implementations are time-consuming and costly to design. In contrast, while programmable paradigms provide greater system flexibility, logic reuse, and lower cost, this is often at the expense of system performance. Programmable paradigms include software-configurable elements such as microprocessors and multi-core processors, which are configured using a series of instructions. Furthermore, programmable paradigms include configurable logic examples such as field programmable gate arrays (FPGA), programmable logic devices (PLD), and read only memories (ROM), that are configured post-manufacture by the electronic system designer (e.g. the consumer). These purpose-built and programmable electronic systems are used for a wide variety of applications including consumer products, industrial automation, communications systems, etc. For these reasons, performance and re-configurability of elements such as logic and processing units are very important to the successful design of electronic systems comprising programmable paradigms.

Different programmable implementations of user-configurable electronic systems have their own strengths and weaknesses. Solutions including microprocessors and multi-core processors, for example, are enormously powerful and can be applied to a wide variety of design problems. However, these processor-based solutions are costly, large, and overly complex for many design problems. The processor-based implementations often leave large portions of processor capability unused and require significant overhead due to operating systems and programming requirements, etc. However, programmable logic solutions can evade many such problems while significantly reducing system complexity and size by implementing only those functions and features that are required by the particular system. Even so, advantages inherent in programmable logic solutions come at the cost of reduced system capabilities, limited configurability, etc. That is, system functions that can be implemented by the programmable logic devices are limited by the capabilities of the programmable devices. Furthermore, the logic devices are based on hardware which can only perform specific functions such as logic, registers or latches for storage, interconnect, and so on. A change in specifications for the electronic system may require additional programmable hardware to meet the new system requirements.

Disclosed embodiments include programmable electronic systems that are based on arrays of interchangeable computing resource elements. The resource elements are allocated based on the requirements of a given system. The processing elements are allocated using a flow graph that is generated by translating a high-level description for logic circuitry. The flow graph, which can be a hyper graph and a control data flow graph, includes information related to sequential operations. The processing elements are allocated to implement the flow graph. The allocation assigns processing elements to three basic groups, based on purpose. The purposes to which the elements can be assigned are computation, communication, and storage, respectively. The processing elements execute sequences of commands, the communication elements enable communication among the processing elements, and the storage elements provide data to the processing elements and store results from the processing elements. As the execution of the flow graph progresses, or a new flow graph is generated based on a new high-level description of logic circuitry, the interchangeable processing elements are reallocated, again based on purpose, creating a fabric of processing elements that is highly flexible and efficient.

Figure 1:
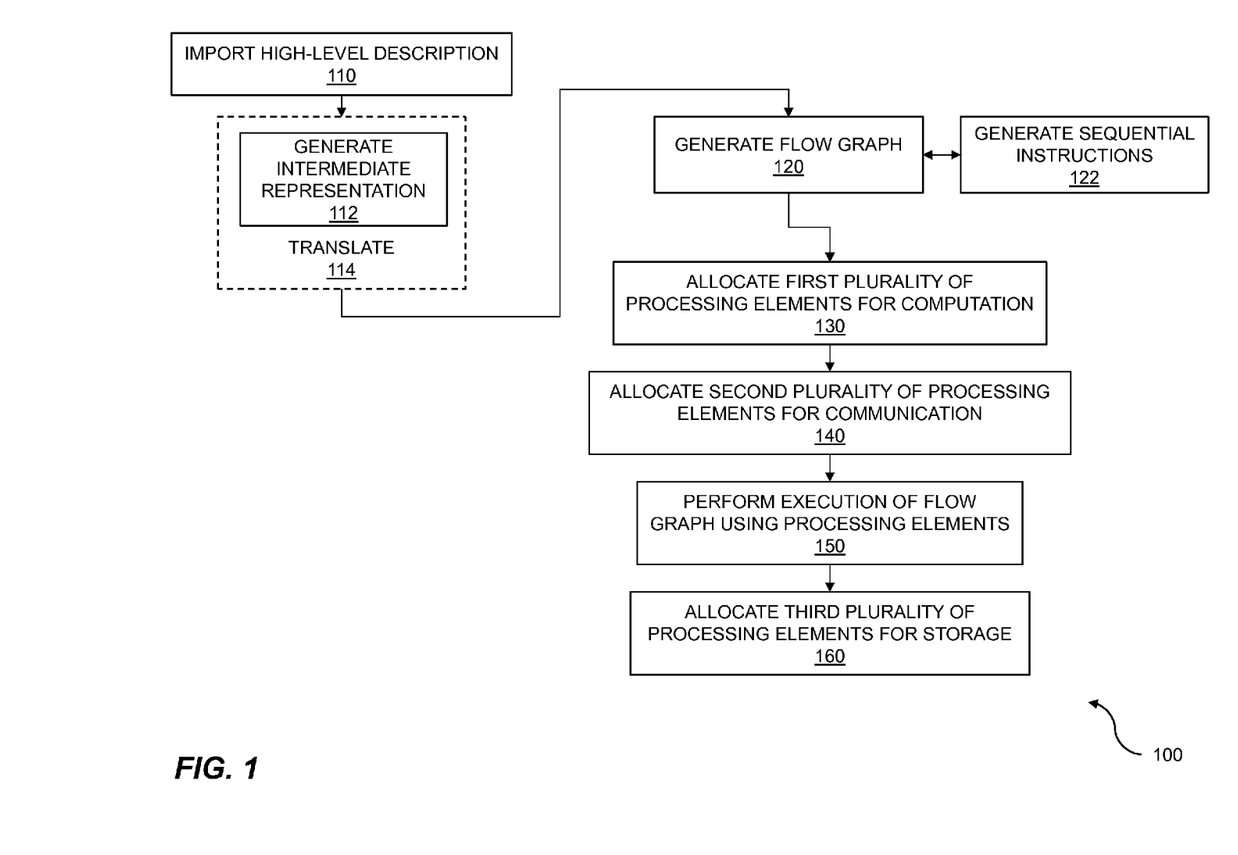
FIG. 1 is a flow diagram for resource allocation.

FIG. 1 is a flow diagram for resource allocation. A flow 100 is shown for computing allocation of processing element resources, based on translation from a high-level description of logic circuitry to a flow graph. The flow 100 can include importing a high-level description 110 for logic circuitry. In other embodiments, the high-level description can be generated within a tool currently being used, drafted by a designer, and so on. The high-level description can include high-level programming languages including Python™, C++™, Java™, C™, MatLab®, OpenCL™, and any other high-level programming language suitable for a high-level description of logic circuitry. The high-level description can include hardware description languages (HDL) including Verilog™, VHDL™, and so on. The high-level description can correspond to logic circuitry. The high-level description for the logic circuit can be read from a file, input by a user, and so on. The file can be obtained using wireless, wired, and manual techniques. The high-level description can be in a machine-readable format.

The flow 100 includes translating 114 the high-level description into a flow graph. The translation can include compiling the high-level description, interpreting the high-level description, converting the high-level description, and so on. In some embodiments, the translating 114 can include generating an intermediate representation 112 based on the high-level description and then translating the intermediate representation into the flow graph. Thus, the flow graph can be generated by translating a high-level description into the flow graph. The flow 100 includes generating the flow graph 120. In embodiments, the flow graph is generated using a flow graph generation tool. In some embodiments, a portion of the flow graph is generated using an automated flow graph generation tool. The flow graph can be formed using a variety of graphical techniques, textual techniques, numerical techniques, etc. The flow graph can be described in an executable format. The translating can include generating sequential operations 122. The sequential operations can perform various processing operations related to the flow graph. The instructions can be directly executable by a processing element, interpretable by the processing element, etc. Based on the flow graph, groupings or blocks of sequential operations can be identified for parallel execution on two or more processing elements. A flow graph can include elements that are referentially transparent, where operation results can be replaced with the values that the operations generate, executed in parallel, and so on. The flow 100 can further comprise generating an intermediate representation 124 as part of the translating. The intermediate representation can include abstract instructions, pseudo instructions, compiler directives, assembler directives, etc. The intermediate representation can include meta-instructions on resource allocation, information on parallelization, and so on. The flow graph can include a control data flow graph (CDFG). The control data flow graph can include nodes and arcs, where the nodes can represent operations of code and the arcs can represent redirections of control and/or data resulting from the operations. In embodiments, the same CDFG can include entry (i.e. initial) blocks, and exit (i.e. terminal) blocks. The CDFG can include sequential operations where code executes without jumps, redirections, and so on. Based on the CDFG, two or more operations can be executed in parallel on two or more processing elements. The flow graph can include a hypergraph. The hypergraph can by definition include graph edges connecting numerous vertices; for example, a hypergraph can include edges connecting three vertices. The hypergraph can also include a generalized representation of the graph.

The flow 100 includes allocating a first plurality of processing elements within an array, based on the flow graph, for computational purposes 130. In embodiments, the flow graph, which can include a control data flow graph (CDFG), a hypergraph (HG) and so on, can represent various operations in code, as described above. The operations can be represented by nodes of a graph, a CDFG, a HG, and so on. The one or more operations in code can be allocated to one or more processing elements within an array. The processing elements within the array can be substantially similar, thus simplifying the allocation process. The allocation of the operations to the processing elements of the array can include a subset of the processing elements, or all of the processing elements. In a situation where the number of operations exceeds the number of processing elements available for computational purposes, a schedule can be imposed to orchestrate the order in which the operations are executed. The schedule can include grouping operations in the order in which they can be executed on a given processing element. The scheduling technique can be based on optimization techniques, on randomization and selection techniques, on best-available techniques, and so on.

The flow 100 includes allocating a second plurality of processing elements, based on the flow graph, for communication purposes 140, including communication between the first plurality of processing elements. The communication purposes can include communication between nodes of the flow graph (e.g. two nodes), communication among nodes of the HG (e.g. three or more nodes), and other communication purposes. The various arcs of the graph, the CDFG, the HG, etc., can describe the communications purposes of the flow graph. The allocating of the second plurality of processing elements can include some or all of the processing elements of the array, some or all of the remaining processing elements not allocated to the first plurality of processing elements, and the like. Elements from the first plurality of processing elements and elements from the second plurality of processing elements can be substantially similar. The substantial similarity can include similarities in processing power and other computational capabilities, communications capabilities, and so on. The substantial similarity can simplify the techniques used for allocating the first plurality of processing elements of the array and the allocating of the second plurality of processing elements of the array. In embodiments, the allocating of the first plurality and/or the allocating of the second plurality are accomplished, in part, by a user pre-allocating certain of the processing elements. In embodiments, a user can write assembly code, or some other type of code, to work around an automation problem in the allocating or to perform some allocating in a manner preferable to a designer. Elements from the first plurality of processing elements and elements from the second plurality of processing elements can be interchangeable. For example, based on a first graph, processing elements of the array might be allocated to a first plurality and to a second plurality as needed. In the same manner, but based on a second graph, processing elements of the same array can be allocated differently to the first plurality and to the second plurality, thus simplifying the process of allocation by using interchangeable, substantially similar processing elements. Additionally, the allocating of the first plurality and the second plurality can be based on any of a variety of scheduling techniques. The scheduling techniques can be optimized based on numerous factors. For example, some embodiments include allocating the first plurality and the second plurality using static scheduling, when static scheduling best fulfills objectives for a particular design. Conversely, allocating the first plurality and the second plurality can be accomplished by dynamic scheduling, random assignment/best-selection scheduling, best-available scheduling, and so on, as dictated by the design objectives. Any appropriate scheduling technique can be used for the allocating of the first plurality of processing elements and the second plurality of processing elements.

The flow 100 can further include performing execution of the flow graph using the first plurality of processing elements and the second plurality of processing elements 150. The performing execution of the flow graph can include performing sequential instructions using the first plurality of processing elements. The sequential instructions can include the operations as described above, with a given processing element of the first plurality of processing elements able to execute one or more operations based on the flow graph, the CDFG, the HG, and so on. The executing of the operations can include direct execution of the code, interpretation of the code, and so on. The performing execution of the flow graph can include communicating among the first plurality of processing elements using the second plurality of processing elements—the elements previously designated to perform communication. The performing execution can be based on a schedule, where the schedule can be a static schedule, a dynamic schedule, and so on. In some cases, the execution can be based on two or more types of scheduling.

The flow 100 can further comprise allocating a third plurality of processing elements within the array for storage operations 160. The storage operations can be determined by the storage requirements of the flow graph, the CDFG, the HG, and so on. The storage operations can also be determined by instructions to place or pull certain data from a storage location. The storage operations can include storing input data, output data, intermediate data, partial data, results, and so on. The data which is stored can be binary data, numerical data, textual data, graphical data, or any other data type appropriate to the flow graph, CDFG, HG, etc., which is being executed. The allocating of the third plurality of processing elements can include allocation of some or all of the processing elements of the array, allocation of some or all of the remaining processing elements not allocated to the first plurality of processing elements and to the second plurality of processing elements, etc. The allocating of the third plurality of processing elements can be based on a schedule, where the schedule can be static, dynamic, and so on. The schedule can be optimized, randomly assigned/selected, best available, and so on. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
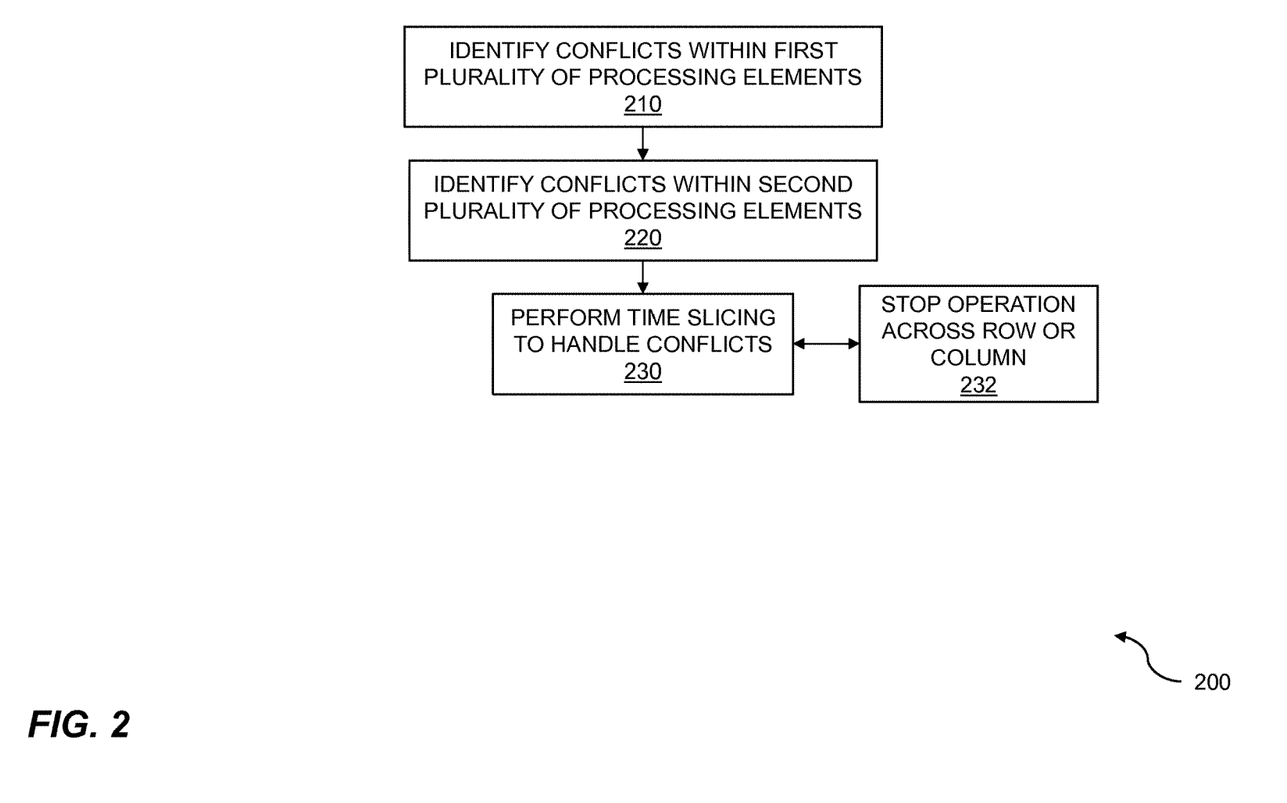
FIG. 2 is a flow diagram for resolving conflicts.

FIG. 2 is a flow diagram for resolving conflicts. A flow 200 is shown for resolving conflicts which can result from performing execution of a flow graph, a control data flow graph (CDFG), a hypergraph (HG), and so on. Recall that processing elements from an array of processing elements are allocated into pluralities of processing elements for various purposes, where the purposes can include computation, communication, storage, and so on. The flow 200 includes identifying conflicts within the first plurality of processing elements 210. In embodiments, the first plurality of processing elements within an array is allocated for computational purposes. The blocks of code, including sequences of instructions, can be assigned to the processing elements of the first plurality. The conflicts can be identified and appropriate corrective techniques can then be applied. The corrective techniques which can be applied can include automated techniques, manual techniques, and so on. In regards to the source of the conflicts, execution conflicts can result from the allocation of operations to processing elements of an array when the assigning of blocks results in violations of a dictated order of operation execution based on the flow graph. For example, certain code for a given flow graph can require execution prior to the execution of other code, thus creating a conflict if a subsequent operation is prioritized for execution. The conflicts can be resolved through scheduling used to impose the proper order of execution of the operations, among other methods.

The flow 200 includes identifying conflicts within the second plurality of processing elements 220. The second plurality of processing elements within an array can be allocated for communication purposes. The communications can take place between and among processing elements to aid in the execution of code blocks or for other computational purposes. The communications can result from sending data to a processing element from the first plurality of processing elements, receiving data from a processing element of the first plurality of processing elements, and so on. A processing element from the second plurality of processing elements can support communication between adjacent processing elements of the first plurality of processing elements, and the processing element can also support communications between nonadjacent processing elements of the first plurality of processing elements. Communication between nonadjacent processing elements can be accomplished by joining processing elements into a communications chain, for example. Conflicts are also possible between processing elements allocated for communication. A communications conflict can result when data needed by a processing element of the first plurality of processing elements is not available, or from multiple processing elements of the first plurality of processing elements requesting data through the same communications processing elements at the same time, among other examples. As was the case for the processing elements of the first plurality of processing elements, conflicts among processing elements of the second plurality of processing elements can be identified, and appropriate resolution techniques can be applied.

The flow 200 includes performing time slicing to handle identified conflicts 230. The computational conflicts identified for the first plurality of processing elements and the communications conflicts identified for the second plurality of processing elements can be addressed by retiming the various processing tasks. The retiming can include speeding up processing and/or communications tasks, delaying processing and/or communications tasks, and so on. The retiming can be accomplished by time slicing. Time slicing can include allowing a specific time duration for a task to be executed on a given processing element before some action is taken, such as, for example, before another task is assigned to be executed on the same processing element. The time slicing can be based on a priority of an operation, where some tasks are given a higher priority of execution and other tasks are given a lower priority of execution. Any number of appropriate actions can be taken, including allowing the process to continue execution for another time slice, delaying execution of the process for a time slice, executing a second process for a time slice, and so on. The time slicing can include stopping operation across a row or column of processing elements 232 in an array of processing elements to resolve congestion going forward in time. The stopping operation across a row or a column of processing elements can accomplish process execution retiming, communications delaying among processing elements, and so on. The stopping operation can allow various processes to complete operation, communications to take place, and so on, so that execution of the flow graph can proceed. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
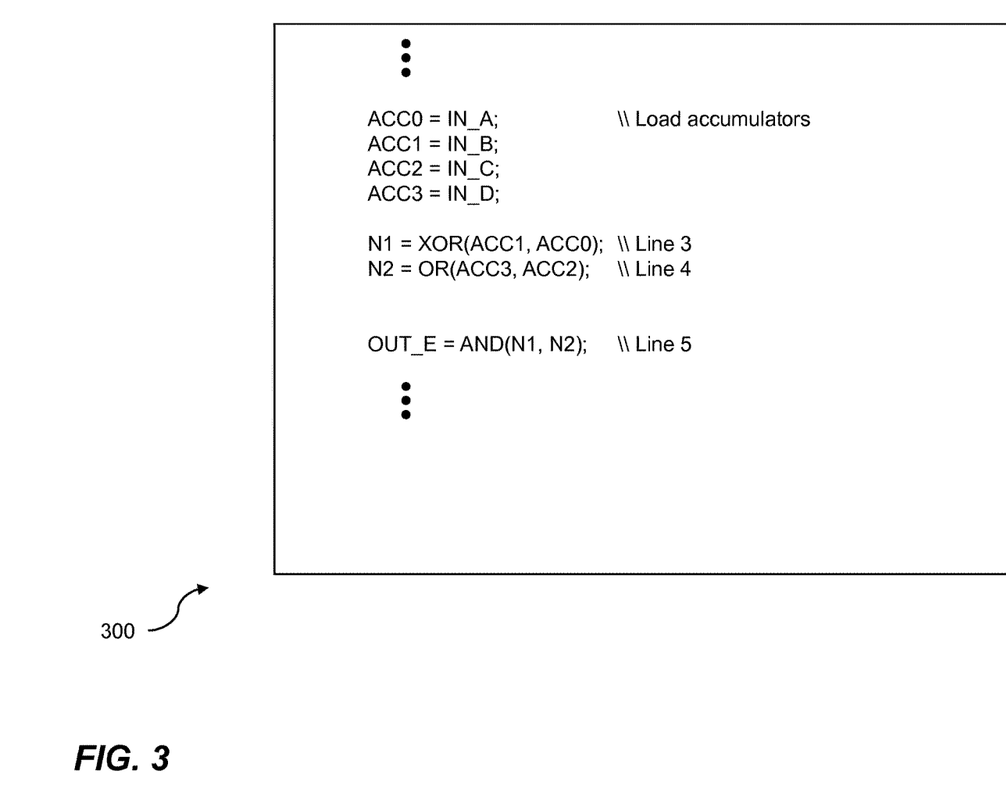
FIG. 3 shows example high-level description code.

FIG. 3 shows example high-level description code. The example code segment 300 shows instructions from a high-level description for logic circuitry. The code segment can be obtained by importing a high-level description for logic circuitry, where the importing can include reading from a file, loading from a computer-readable device, inputting by a user, and so on. The high-level description code can be written in a general purpose programming language including Python™, Java™, C++™, C™, etc.; a hardware description language including Verilog™, VHDL™, etc.; or any other programming language suitable to describing logic circuitry. The high-level description code can define logic circuitry from a structural perspective, from a behavioral perspective, and so on. The logic description can include one or more logical hierarchies. The high-level description code can be used to define a dataflow graph, a hypergraph (HG), a control data flow graph (CDFG), and the like. The various elements of the high-level description code can describe various types of logic circuitry including the families of static logic, the families of dynamic logic, the families of hybrid and mixed-signal logic, and so on.

Figure 4:
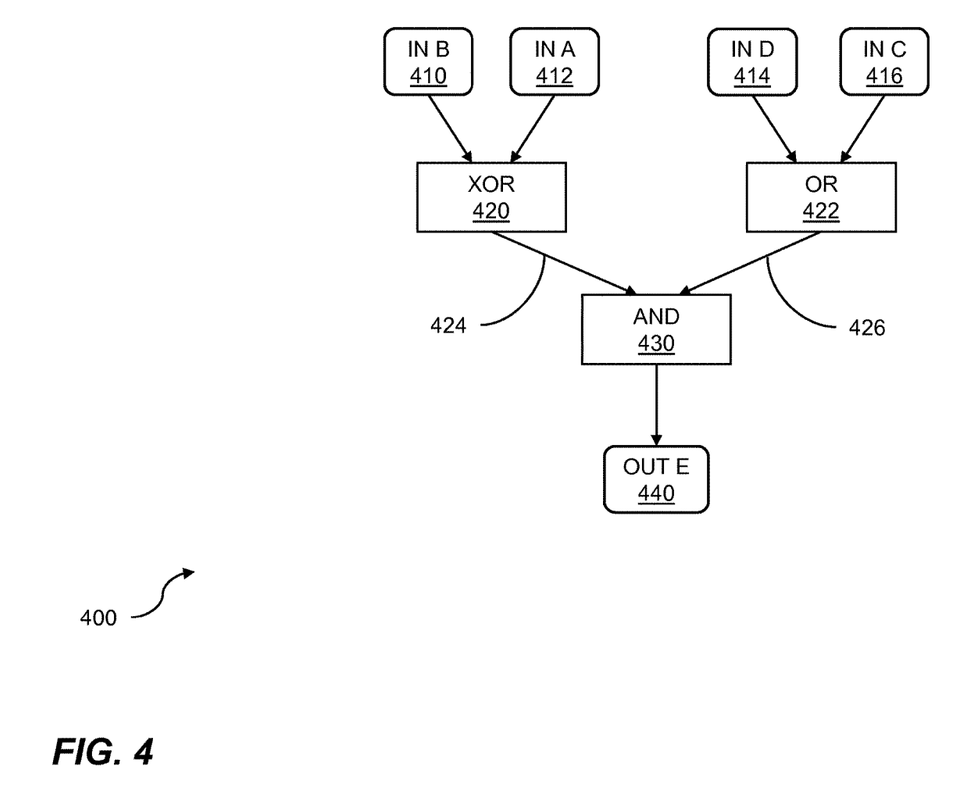
FIG. 4 is an example flow graph.

FIG. 4 is an example flow graph. The graph 400 is a flow graph for logic circuitry and, in embodiments, is derived from a high-level description for the logic circuitry. The logic circuitry described by the flow graph can include static logic, dynamic logic, and so on. The flow graph 400 can be obtained by translating the high-level description into a flow graph. The flow graph can include a control data flow graph (CDFG), a hypergraph (HG), and any other graph appropriate to describing logic circuitry. The graph can include operations, where the operations can comprise sequential instructions. The graph can be based on intermediate representations of the logic circuitry.

The example flow 400 can include one or more entry, or initial, nodes such as node B 410, node A 412, node D 414, and node C 416, for example. Any number of entry (initial) nodes can be included. The entry nodes 410, 412, 414, and 416 can handle input data, where the input data can include binary data, alphanumeric data, graphical data, and so on. For example, binary input data can include a bit, a nibble, a byte, a binary vector, and so on. The entry nodes can be connected by one or more arcs (vertices) to one or more other nodes. For example, the entry nodes B 410 and A 412 can be connected to an intermediate node 420, and the entry nodes D 414 and C 416 can be connected to another intermediate node 422. The nodes can serve any purpose appropriate to logic circuitry, including Boolean operations, mathematical operations, storage operations, and so on. For example, the intermediate node 420 can perform an XOR Boolean operation, and the intermediate node 422 can perform an OR Boolean operation. More complex Boolean operations or other operations can also be performed.

The intermediate nodes 420 and 422 of the example flow graph 400 can be connected to one or more other nodes, where the other nodes can be intermediate nodes, exit (terminal) nodes, and so on. Returning to the example, the intermediate nodes 420 and 422 can be connected by the arcs (vertices) 424 and 426, respectively, to another intermediate node 430. As before, the intermediate node or nodes can serve any purpose appropriate to logic circuitry. For example, the intermediate node 430 can perform an AND Boolean operation. Other complex operations, Boolean operations, and so on, can also be performed. The intermediate node 430 can be connected to one or more other nodes, where the other nodes can be intermediate nodes, exit or terminal nodes, and so on. Continuing with the example, the intermediate node 430 can be connected to an exit or terminal node OUT E 440. The node E 440 can serve as an input to another flow, as a storage node or a communication node, and so on. While one flow graph is shown, many flow graphs could be similarly executed, executed simultaneously, and so on.

Figure 5:
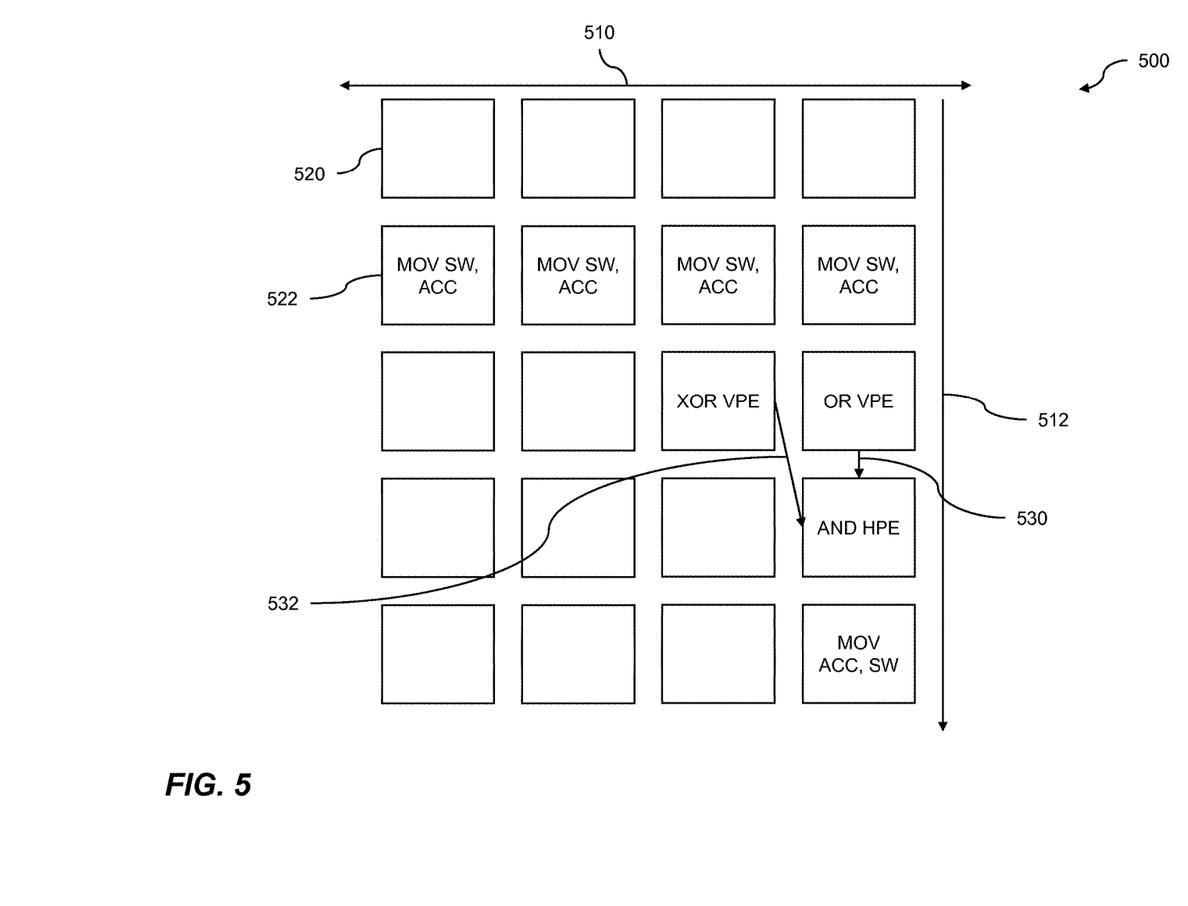
FIG. 5 shows example processing elements with operations executed over time.

FIG. 5 shows example processing elements with operations executed over time 500. Some processors 510 from an array of processing elements are shown. The processors 510 represent a subset of the processors available in the array. The processors 510 can be used for different purposes, shown moving forward in time 512. A processor 520 from the array of the processors 510 can be allocated to various purposes over time. The processors 510 can be allocated to pluralities of processors for the various purposes, where the various purposes can include computation, communication, storage, etc. The flow graph can be executed using the various processing elements across the series of time steps 512. For example, a first plurality of processors can be used for computational purposes, a second plurality of processors can be used for communications purposes, a third plurality of processors can be used for storage operations, and so on. The first plurality of processing elements, the second plurality of processing elements, the third plurality of processing elements, and so on, can be coordinated across the series of time steps 512. The purpose of a given processor or of the pluralities of processors can change over time. Elements from the first plurality of processing elements, which were at first allocated to processing purposes, can be used for communication purposes at a subsequent time step, for example. Similarly, in another example, elements from the first plurality of processing elements can be used for storage purposes at a subsequent time step, and so on. Elements from the second plurality of processing elements which were at first allocated to serve a communication purpose can be used for computational purposes at a subsequent time step. Similarly, elements from the second plurality of processing elements can also be used for storage purposes at a subsequent time step, and so on. In some embodiments, a time step can be referred to as a tic or a sub-tic. In essence a time step is a period of time over which logic signals are maintained or are settled to specific values. In embodiments, the processing elements are synchronized within a time step.

The example 500 shows that some or all of the processing elements of the array of processing elements can be used for computational purposes. For example, a processing element 522 can be assigned a move instruction in order to set up input data. Similarly, any number of other processing elements can be allocated to computational purposes, for example. As time 512 progresses, additional nodes of the flow graph can be assigned to be executed by processing elements of the array of processing elements. While the processing element 522 remains idle for the remaining time steps of this example, it might not remain idle while executing other flow graphs. The processing element 522 and the other processing elements can be assigned new tasks. Data can also be transferred, moving forward in time. The arrows 530 and 532 can indicate two such data transfers, moving forward in time. Any other number of data transfers can occur. In some embodiments, data output from one processing element in the third plurality of processing elements allocated for storage operations can be used as an input to another processing element that is part of the first plurality of processing elements or the second plurality of processing elements, allocated for computational purposes or communication purposes, respectively. Data can be stored and transferred using various communication techniques, including synchronous and asynchronous techniques. In embodiments, communication from one processing element to a second processing element can be accomplished via an accumulator input on the second processing element.

Figure 6:
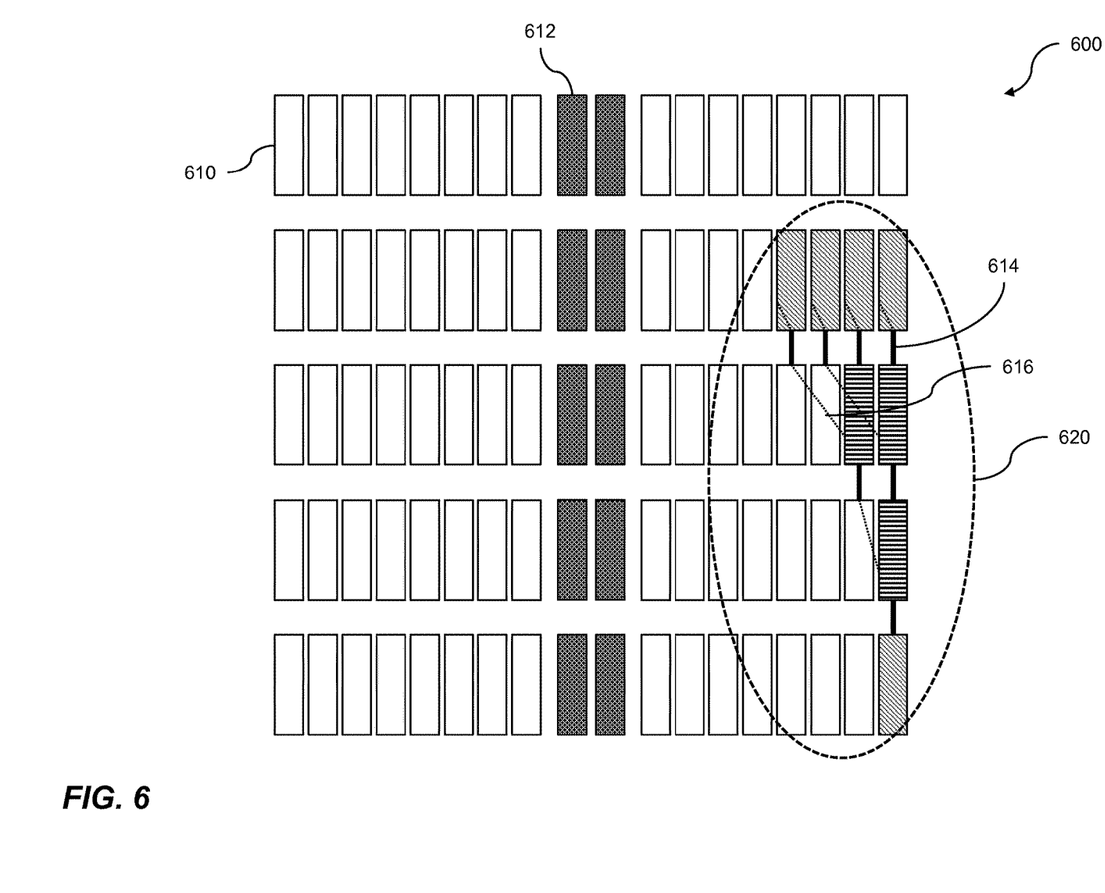
FIG. 6 shows an example larger view of processing elements.

FIG. 6 shows an example larger view of processing elements. Processing elements can be included in an array 600. The array can include the processing elements 610 which can be organized in rows and columns, for example, as well as other structures appropriate to support and expand the capabilities of an array of processing elements. In some embodiments, the array of processing element includes the support elements 612. The support elements 612 can be used for such purposes as communications between the left side and right side of the example array; power distribution for power and ground signals to the left and right sides of the array; input and output signal support; and other functions appropriate to supporting an array of processing elements. The various processing elements of the array of processing elements can be allocated to one or more pluralities of processing elements for various purposes, including computational purposes, communications purposes, storage purposes, and so on. The pluralities of processing elements can be allocated based on a flow graph. For example, the flow graph shown in FIG. 4 can be used to allocate the processing elements of the array 600 into one or more pluralities of processing elements for computation, communication, and storage purposes. An example time step allocation of processing elements moving forward chronologically 620 is shown. Any number of processing elements of the array can be allocated for each time step. Data from one set of operations taking place in a given time step can be passed forward 614 to the set of operations taking place in the next time step. When the processing elements to which the data is passed forward are allocated to the plurality of processing elements for communications purposes, the data which is passed forward can be transferred to another processing element 616.

Execution of the flow graph can proceed forward in time as processing elements are allocated to pluralities of processing elements and data is available to be processed by the processing elements, for example. In certain situations, a processing element might be allocated to perform a certain task based on the flow graph, but data required by the processing element might not be available. Such a situation can include a conflict, where not all required data is available for processing. In order for processing to proceed in this situation, the conflict must be resolved and the required data made available. The example 600 can include identifying conflicts within the first plurality of processing elements. When conflicts are identified, various techniques including time slicing can be used to resolve the conflict. The time slicing can include stopping operation of the processing elements across a row or across a column of the array long enough for the conflict to be resolved. Once the conflict is resolved, the processing can continue.

The example 600 can include an apparatus for logical calculation comprising: a first plurality of processing elements within an array allocated, based on a flow graph, for computational purposes, wherein the flow graph was determined based on translation of a high-level description for logic circuitry; and a second plurality of processing elements within the array allocated, based on the flow graph, for communication purposes including communication between the first plurality of processing elements.

Figure 7:
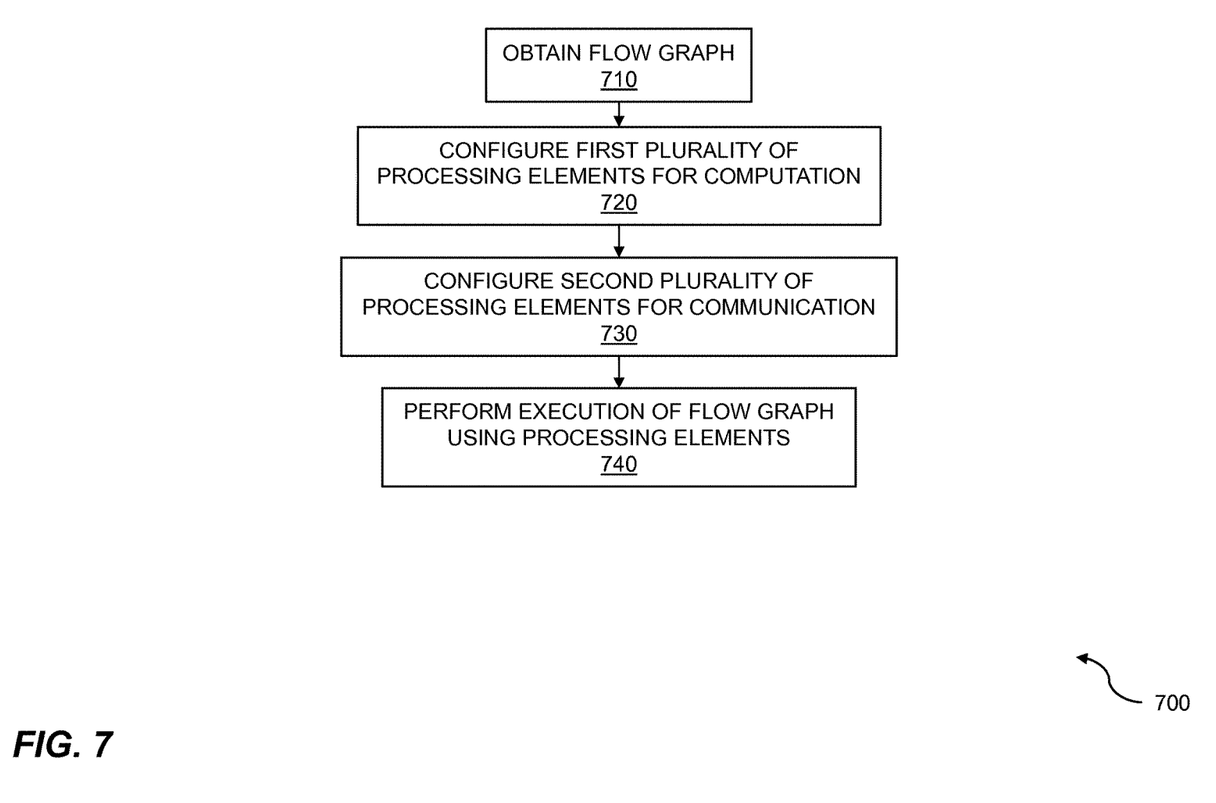
FIG. 7 is a flow diagram for logical calculation.

FIG. 7 is a flow diagram for logical calculation. The flow 700 shows a computer-implemented method for logical calculation. The flow 700 includes obtaining a flow graph 710. The flow graph 710 can be obtained by any appropriate technique, including reading from a computer-readable medium, inputting by a user, and so on. The flow graph can be described using binary data, alphanumeric data, graphical data, etc. The flow graph which is obtained can be a control data flow graph (CDFG), a hypergraph (HG), or another appropriate flow graph. The flow graph can include operations, where the operations can comprise sequential operations. The flow graph can include intermediate representations of the graph, where the intermediate representations can comprise code segments, meta-instructions, pseudo-instructions, and so on. The operations for sequential instructions which describe the flow graph can be used to configure pluralities of processing elements in order to execute the flow graph.

The flow 700 includes configuring, based on the flow graph, a first plurality of processing elements within an array of processing elements for computational purposes 720. The processing elements in the array can be substantially similar to one another with respect to processing power, communication abilities, storage amounts, and so on. The processing elements can be interchangeable among various processing purposes. The processing elements in the array can be configured to execute sequential operations, as one example. The configuring of the processing elements can include setting a schedule of execution for sequential instructions.

The flow 700 includes configuring, based on the flow graph, a second plurality of processing elements within an array of processing elements for communication purposes 730, including communication among the first plurality of processing elements. The configuring of the second plurality of processors can including configuring some or all of the processing elements in the array of processing elements, configuring some or all of the processing elements not configured in the first plurality of processing elements, and so on. The communication purposes can include providing input data to the first plurality of processing elements, routing intermediate data among processing elements, collecting result data, and so on. The communication can occur among adjacent processing elements and among nonadjacent processing elements. For example, two or more processing elements assigned to communication can be chained together to link nonadjacent processing elements.

The flow 700 includes performing execution of the flow graph using the first plurality of processing elements and the second plurality of processing elements 740. Having configured, based on the flow graph, the first plurality of processing elements and the second plurality of processing elements, the flow graph which was obtained can be executed. The executing of the flow graph can include execution of the one or more operations, where the operations comprise sequential operations, for example. The executing of the flow graph can include providing input data to the configured processing elements, routing intermediate data among the configured processing elements, collecting results from the configured processing elements, and so on. The executing of the flow graph can include scheduling the execution of the operations for sequential instructions based on criteria including throughput, congestion, data requirements, and so on.

Figure 8:
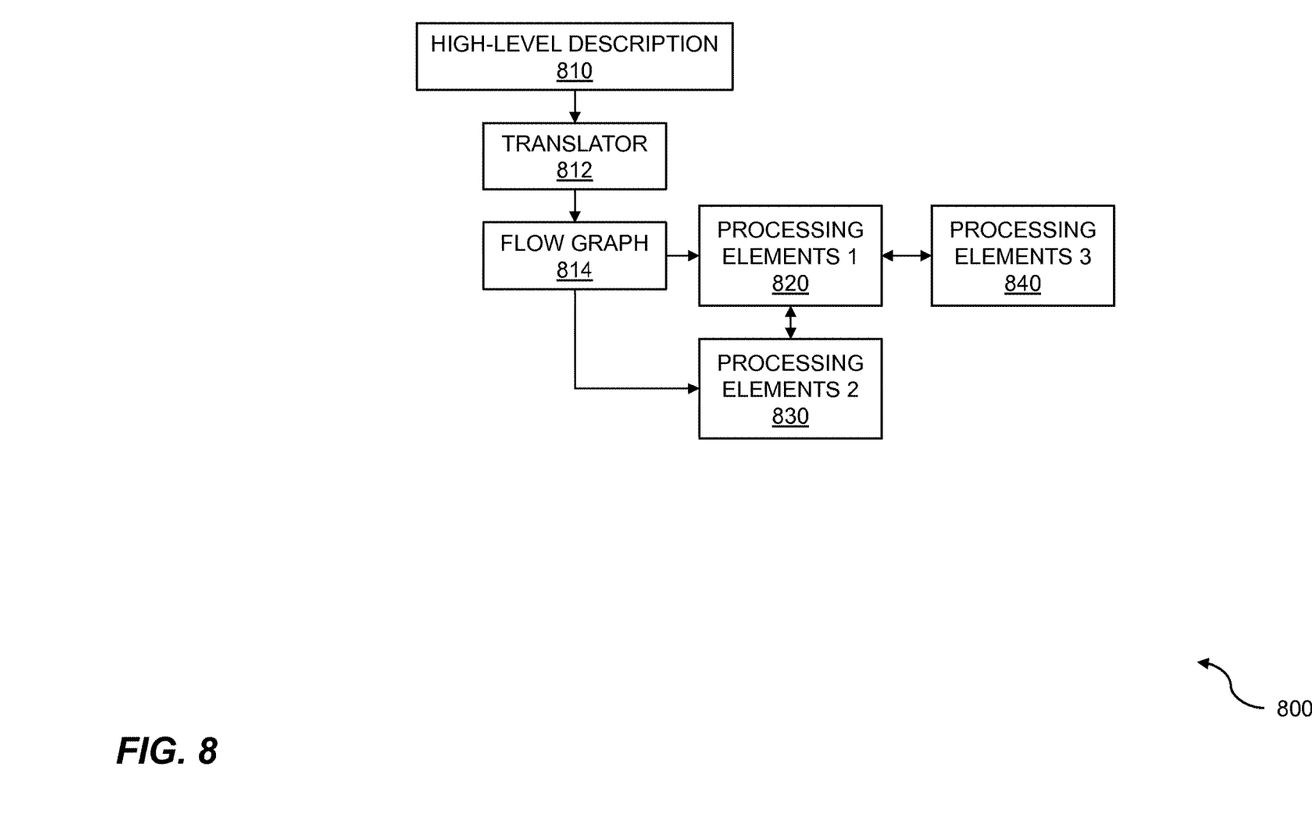
FIG. 8 is a block diagram for logical calculation.

FIG. 8 is a block diagram for logical calculation. The block diagram 800 is shown for logical calculation based on a flow diagram. The logical calculation can be performed based on a high-level description for logic circuitry which can be read from a computer-readable medium, provided by a user, provided through wired and wireless techniques, and so on. The block diagram 800 includes a high-level description 810 for logic circuitry. The high-level description for logic circuitry can be based on a high-level computing language such as Python™, C++™, Java™, C™ or another computing language; based on a hardware description language (HDL) including Verilog™, VHDL™, etc., or based on another computer-readable description.

The block diagram 800 includes a translator 812 which takes the high-level description as an input and produces a flow graph 814 as an output. The translator 812 can translate the high-level description for logic circuitry into any appropriate representation of a flow graph. The flow graph can include a control data flow graph (CDFG), a hypergraph (HG), and so on. The flow graph can include one or more groups of sequential operations, one or more intermediate representations of the flow graph, and so on. The flow graph can be represented in any appropriate computer readable format including binary format, alphanumeric format, graphical format, and so on.

The block diagram 800 includes processing elements. The processing elements can be arranged into pluralities of processing elements, including the processing elements 1 820, the processing elements 2 830, and the processing elements 3 840, for example. The processing elements can be included in an array of processing elements. The pluralities of processing elements can be identified by the processing purpose, where the processing purpose can include computation, communication, storage, and the like. The processing elements can be substantially similar in terms of processing capabilities including processing speed, communication modes and configurations, storage types and amounts, and so on. The processing elements can be interchangeable and can be used for any appropriate processing purpose. Allocation of processing elements of the array to the pluralities of processing elements 820, 830, and 840 can be based on the flow graph 814. For example, the allocating can include allocating the first plurality of processing elements 820 within an array, based on the flow graph, for computational purposes; allocating the second plurality of processing elements 830, based on the flow graph, for communication purposes including communication between elements within the first plurality of processing elements; and allocating the third plurality of processing elements 840 within the array of processing elements for storage purposes. The pluralities of processing elements can be used to execute the flow graph 814.

Figure 9:
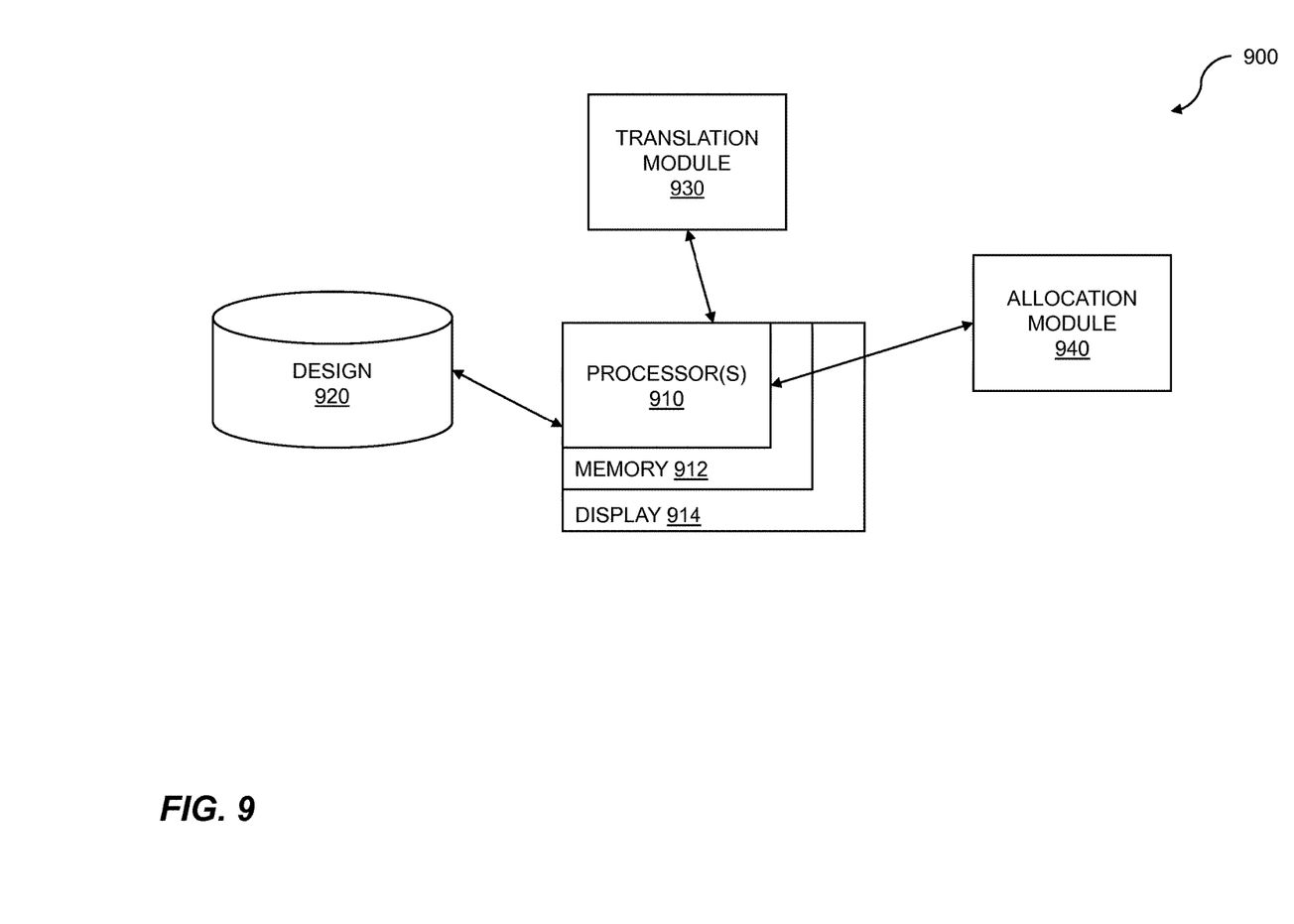
FIG. 9 is a system diagram for resource allocation.

FIG. 9 is a system diagram for resource allocation. The system 900 can include one or more processors 910 coupled to a memory 912. The memory 912 can be used to store computer code instructions, blocks of sequential code, logic circuitry representations, data, intermediate data, computation results, and the like. A display 914 can be included and can be any electronic display including a computer display, a laptop screen, a netbook screen, a surface screen, a tablet screen, a smartphone display, a personal digital assistant (PDA) display, a mobile device display, a remote with a display, a television, a video projector, and so on. A computer program running on the processors 910 can perform computing resource allocation based on flow graph translation.

A high-level description for logic circuitry design 920 can be stored on computer-readable media including a hard disk drive (HDD), a solid-state drive (SSD), an optical drive, a nonvolatile drive, or another form of storage media coupled to the one or more processors 910. The high-level description for logic circuitry can include one or more representations of the logic circuitry. The one or more high-level descriptions can be any type of logic circuitry representation including a structural representation, a functional representation, and so on. The logic circuitry representation can be written in any appropriate computer programming language including Python™, Java™, C++™, C, etc.; a hardware description language including Verilog™, VHDL™, etc.; logic-level descriptions, and so on. The high-level description of the logic circuitry can be imported by the one or more processors 910 by accessing the description 920 on the computer-readable media.

A translation module 930 can be included with the system 900 to translate the high-level description for logic circuitry into a flow graph. The translating can include generating sequential operations to be executed on the one or more processors 910. The translating can also include generating one or more intermediate representations. The intermediate representations can include abstract instructions, pseudo instructions, and so on. The intermediate representations can include meta instructions which can provide guidance to the translating in regards to resource allocation, information on parallelization, and so on.

An allocation module 940 can be included in the system 900. The allocation module 940 can allocate the one or more processors 910 to pluralities of processors for various purposes. The various purposes to which the processors can be allocated can include computational purposes, communication purposes, storage purposes, and so on. The allocation of the processors can be based on the flow graph created by the translation module 930. Based on the allocation of the one or more processors, the flow graph based on the translation can be executed. Results of the execution of the flow graph can be stored in the memory 912, displayed on the display 914, and so on.

The system 900 can include a computer program product embodied in a non-transitory computer readable medium for implementation of a logical calculation apparatus comprising: code for importing a high-level description for logic circuitry; code for translating the high-level description into a flow graph; code for allocating a first plurality of processing elements within an array, based on the flow graph, for computational purposes; and code for allocating a second plurality of processing elements, based on the flow graph, for communication purposes including communication between the first plurality of processing elements.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for dynamic configuration of hardware computing resources comprising:
   generating a flow graph, wherein the flow graph is generated by translating a high-level description into the flow graph;
   configuring a first plurality of hardware processing elements within a reconfigurable array for computational purposes, based on the flow graph;
   configuring a second plurality of hardware processing elements within the reconfigurable array, based on the flow graph, for communication purposes including communication between the first plurality of processing elements, and wherein communication from one processing element to a second processing element is accomplished via an accumulator input on the second processing element; and
   configuring a third plurality of processing elements within the reconfigurable array for storage purposes, wherein elements from the first plurality of processing elements, elements from the second plurality of processing elements, and elements from the third plurality of processing elements are interchangeable on subsequent time steps, wherein the configuring of the first plurality of processing elements, the second plurality of processing elements, and the third plurality of processing elements is accomplished by static scheduling, and further comprising identifying conflicts based on the flow graph and performing time slicing to handle identified conflicts.

2. The method of claim 1 wherein the flow graph is generated using a flow graph generation tool.

3. The method of claim 1 wherein the translating comprises generating an intermediate representation based on the high-level description and then translating the intermediate representation into the flow graph.

4. The method of claim 1 wherein the configuring of the first plurality and the configuring of the second plurality are accomplished, in part, by a user pre-configuring certain of the processing elements.

5. The method of claim 1 further comprising performing execution of the flow graph using the first plurality of processing elements and the second plurality of processing elements.

6. The method of claim 5 wherein elements from the first plurality of processing elements and elements from the second plurality of processing elements are substantially similar.

7. The method of claim 5 wherein elements from the first plurality of processing elements and elements from the second plurality of processing elements are interchangeable.

8. The method of claim 5 wherein elements from the first plurality of processing elements are used for communication purposes at a subsequent time step.

9. The method of claim 5 wherein elements from the second plurality of processing elements are used for computational purposes at a subsequent time step.

10. The method of claim 1 further comprising configuring a third plurality of processing elements within the array for storage operations.

11. The method of claim 10 wherein data output from one processing element in the third plurality is used as an input to another processing element that is part of the first plurality of processing elements or the second plurality of processing elements.

12. The method of claim 1 wherein the configuring the first plurality and the second plurality is accomplished by static scheduling.

13. The method of claim 1 wherein the flow graph includes a control data flow graph (CDFG).

14. The method of claim 13 wherein the CDFG includes information related to sequential operation.

15. The method of claim 1 wherein the flow graph includes a hyper graph.

16. The method of claim 1 further comprising identifying conflicts within the first plurality of processing elements.

17. The method of claim 1 further comprising identifying conflicts within the second plurality of processing elements.

18. The method of claim 1 further comprising performing time slicing to handle identified conflicts.

19. The method of claim 1 wherein the flow graph is executed across a series of time steps.

20. The method of claim 19 wherein the first plurality of processing elements and the second plurality of processing elements are coordinated across the series of time steps.

21. The method of claim 1 wherein configuring the first plurality of hardware processing elements includes allocating the first plurality of hardware processing elements for computational purposes.

22. The method of claim 1 wherein configuring the second plurality of hardware processing elements includes allocating the second plurality of hardware processing elements for communication purposes.

23. The method of claim 1 further comprising performing a logical calculation using the first plurality of processing elements and the second plurality of processing elements.

24. The method of claim 23 further comprising presenting a result of the logical calculation on a display.

25. A computer program product embodied in a non-transitory computer readable medium for implementation of a logical calculation apparatus, the computer program product comprising code which causes one or more processors to perform operations of:
generating a flow graph, wherein the flow graph is generated by translating a high-level description into the flow graph;
configuring a first plurality of hardware processing elements within a reconfigurable array for computational purposes, based on the flow graph;
configuring a second plurality of hardware processing elements within the reconfigurable array, based on the flow graph, for communication purposes including communication between the first plurality of processing elements, wherein communication from one processing element to a second processing element is accomplished via an accumulator input on the second processing element; and
configure a third plurality of processing elements within the reconfigurable array for storage purposes, wherein elements from the first plurality of processing elements, elements from the second plurality of processing elements, and elements from the third plurality of processing elements are interchangeable on subsequent time steps, wherein the configuring of the first plurality of processing elements, the second plurality of processing elements, and the third plurality of processing elements is accomplished by static scheduling, and further comprising identifying conflicts based on the flow graph and performing time slicing to handle identified conflicts.

26. A computer system for implementation of a logical calculation apparatus comprising:
a memory which stores instructions;
one or more processors coupled to the memory wherein the one or more processors are configured to:
generate a flow graph, wherein the flow graph is generated by translating a high-level description into the flow graph;
configure a first plurality of hardware processing elements within a reconfigurable array for computational purposes, based on the flow graph;
configure a second plurality of hardware processing elements within the reconfigurable array, based on the flow graph, for communication purposes including communication between the first plurality of processing elements, wherein communication from one processing element to a second processing element is accomplished via an accumulator input on the second processing element; and
configuring a third plurality of processing elements within the reconfigurable array for storage purposes, wherein elements from the first plurality of processing elements, elements from the second plurality of processing elements, and elements from the third plurality of processing elements are interchangeable on subsequent time steps, wherein the configuring of the first plurality of processing elements, the second plurality of processing elements, and the third plurality of processing elements is accomplished by static scheduling, and further comprising identifying conflicts based on the flow graph and performing time slicing to handle identified conflicts.

* * * * *